United States Patent
Takahashi et al.

(10) Patent No.: US 8,965,153 B2
(45) Date of Patent: Feb. 24, 2015

(54) OPTICAL SEMICONDUCTOR DEVICE AND OPTICAL WAVEGUIDE

(75) Inventors: Makoto Takahashi, Kokubunji (JP); Hideo Arimoto, Kodaira (JP); Kazuhiko Hosomi, Tachikawa (JP); Toshihiko Fukamachi, Kokubunji (JP); Shigeki Makino, Kokubunji (JP); Yasunobu Matsuoka, Hachioji (JP); Toshiki Sugawara, Kokubunji (JP)

(73) Assignee: Hitachi Ltd., Tokyo (JP)

( * ) Notice: Subject to any disclaimer, the term of this patent is extended or adjusted under 35 U.S.C. 154(b) by 0 days.

(21) Appl. No.: 11/950,447

(22) Filed: Dec. 5, 2007

(65) Prior Publication Data

US 2008/0137695 A1   Jun. 12, 2008

(30) Foreign Application Priority Data

Dec. 6, 2006   (JP) .................... 2006-328938

(51) Int. Cl.
| | | |
|---|---|---|
| G02B 6/26 | (2006.01) | |
| H01S 5/026 | (2006.01) | |
| G02B 6/122 | (2006.01) | |
| G02B 6/125 | (2006.01) | |
| H01S 5/02 | (2006.01) | |
| H01S 5/028 | (2006.01) | |
| H01S 5/10 | (2006.01) | |
| H01S 5/12 | (2006.01) | |
| H01S 5/32 | (2006.01) | |

(52) U.S. Cl.
CPC ............. *H01S 5/026* (2013.01); *G02B 6/1228* (2013.01); *G02B 6/125* (2013.01); *H01S 5/021* (2013.01); *H01S 5/028* (2013.01); *H01S 5/1014* (2013.01); *H01S 5/12* (2013.01); *H01S 5/3224* (2013.01)
USPC ................... 385/28; 257/E33.067; 372/9

(58) Field of Classification Search
USPC ................... 385/28; 372/9; 257/E33.067
See application file for complete search history.

(56) References Cited

U.S. PATENT DOCUMENTS

| | | | |
|---|---|---|---|
| 5,982,961 A | * | 11/1999 | Pan et al. .................. 385/30 |
| 6,027,989 A | | 2/2000 | Poole et al. |
| 6,310,995 B1 | | 10/2001 | Saini et al. |
| 6,330,378 B1 | | 12/2001 | Forrest et al. |

(Continued)

FOREIGN PATENT DOCUMENTS

| | | |
|---|---|---|
| FR | 2 851 826 | 9/2004 |
| JP | 2003-521815 | 7/2003 |

(Continued)

OTHER PUBLICATIONS

Fang, et al, "Electrically Pumped Hybrid AlGaInAs-silicon Evanescent Laser", Optics Express, Optical Society of America, Washington, DC, US, vol. 14, No. 20, Oct. 2, 2006 (pp. 9203-9210).

(Continued)

*Primary Examiner* — Telly Green
*Assistant Examiner* — Jamie C Niesz
(74) *Attorney, Agent, or Firm* — Antonelli, Terry, Stout & Kraus, LLP.

(57) ABSTRACT

A core of an optical waveguide and a core of a waveguide type optical device are adjacently disposed, and a layer is continuously formed at one end of the core of the waveguide type optical device, wherein an effective refractive index of the layer decreases toward a long axis direction of the optical waveguide stripe.

12 Claims, 13 Drawing Sheets

(56) References Cited

U.S. PATENT DOCUMENTS

| | | | |
|---|---|---|---|
| 6,980,720 B2* | 12/2005 | Gothoskar et al. | 385/43 |
| 7,288,794 B2 | 10/2007 | Marsh et al. | |
| 2005/0078904 A1* | 4/2005 | Sato et al. | 385/14 |
| 2005/0265653 A1* | 12/2005 | Cai et al. | 385/28 |

FOREIGN PATENT DOCUMENTS

| | | | | |
|---|---|---|---|---|
| JP | 2003-533896 | | 11/2003 | |
| KR | WO 02/29905 | * | 4/2002 | H01L 31/12 |
| WO | WO 96/27226 | | 9/1996 | |
| WO | WO01/88577 | | 11/2001 | |
| WO | WO 02/29905 | * | 4/2002 | H01L 31/12 |
| WO | WO02/29905 | | 4/2002 | |
| WO | WO02/075387 | | 9/2002 | |
| WO | WO2004/092782 | | 10/2004 | |
| WO | WO 2005/051068 | | 6/2005 | |

OTHER PUBLICATIONS

Fang, et al, "A Continuous-Wave Hybrid ALGaInAs-Silicon Evansescent Laser", IEEE Photonics Technology Letters, vol. 18, No. 10, May 15, 2006, pp. 1143-1144.

Studenkov et al, "Efficient Coupling in Integrated Twin-Waveguide Lasers Using Waveguide Tapers", IEEE Photonics Technology Letters, IEEE Service Center, Piscataway, NJ Sep. 1, 1999 pp. 1096-1098.

Alexander W. Fang, et al., A Continuous- Wave Hybird AlGaInAs-Silicon Evanescent Laser, IIEE Photonics Technology Letters, May 15, 2006, p. 1143-1145, vol. 18, No. 10.

M. Aoki, et al., Wide-Temperature-Range Operation of 1.3 μm Beam Expander-Integrated Laser Diodes Grown by In-Plane Thickness Control MOVPE Using a Silicon Shadow Mask, IIEE Photonics Technology Letters, Apr. 1996, p. 479-481, vol. 8. No. 4.

Masahiro Aoki. et al., InGaAs/InGaAsP MQW Electroabsorption Modulator Integrated with a DFB Laser Fabricated by Band-Gap Energy Control Selective Area MOCVD, IIEE Journal of Quantum Electronics, Jun. 1993, pp. 2088-2096, vol. 29, No. 6.

Office Action in JP 2006-328938, dated Jun. 28, 2011, (in Japanese, 3 pgs), with English language translation (5 pgs.).

Office Action in 2006-328938, issued Mar. 6, 2012, (in Japanese, 2 pgs.), (English language translation, 3 pgs.).

* cited by examiner

Position

Position

OPTICAL SEMICONDUCTOR DEVICE AND OPTICAL WAVEGUIDE

INCORPORATION BY REFERENCE

The present application claims priority from Japanese application JP-A-2006-328938 filed on Dec. 6, 2006, the content of which is hereby incorporated by reference into this application.

BACKGROUND OF THE INVENTION

The present invention relates to an optical semiconductor device and an optical waveguide, and more particularly to a technology of coupling optical waveguides mutually without a large optical loss.

Demands for a large capacity optical communication device are increasing with a recent increase in communication traffic. Therefore, miniaturization of optical components effective in increasing the capacity of the device is being studied vigorously at various places. For example, a technology of using a Si wire in order to miniaturize an optical waveguide circuit is being studied. The Si wire optical waveguide confines light within the core more strongly in comparison with a conventional case that Silica glass or polymer is used. Therefore, an allowable minimum curvature radius decreases, and the optical waveguide circuit can be made compact. Meanwhile, since the Si wire optical waveguide has a small light spot size, there is a problem that an optical coupling loss with respect to a waveguide type optical device such as a semiconductor laser increases in comparison with the conventional one.

Under this situation described above, a device having a laser beam efficiently coupled with the Si wire by directly bonding the active layer of a semiconductor laser along the optical axis of the Si wire is being studied (A. W. Fang et al., IEEE Photonic Technology Letters, Vol. 18, No. 10. pp. 1143-1145 (2006)). The structure of the device is described with reference to FIGS. 13A, 13B. FIG. 13A is a perspective view, and FIG. 13B is a y-z cross-sectional view taken along A-A' of FIG. 13A. As shown in those drawings, this device has a Si substrate 11, a Si oxide film layer 12, a Si core layer 13, a compound semiconductor core layer 14 and a compound semiconductor substrate 15 stacked in this order from bottom to top. Further, a high reflecting coating 61 and a low reflecting coating 62 are respectively applied to both end surfaces which are perpendicular to the z-axis in the same manner as an ordinary Fabry-Perot type semiconductor laser. By configuring as described above, the semiconductor laser can be formed along the z-axis defined as an optical axis and the area between z0 and z1 in the drawing defined as a resonator region 21. In other words, laser oscillation can be obtained by performing current injection or light excitation of the above structure. In this case, a gain is produced from the compound semiconductor core layer 14, and the compound semiconductor core layer 14 becomes an active layer of the semiconductor laser. Furthermore, the Si core layer 13 and the compound semiconductor substrate 15 also play roles of a lower cladding layer and an upper cladding layer of the semiconductor laser, respectively. In this case, Si generally has a refractive index higher than that of the compound semiconductor, so that the center of a light intensity distribution 41 is not within the compound semiconductor core layer 14 but within the Si core layer 13 according to the structure as described above (as shown in FIG. 13B). Thus, this device can obtain high optical coupling with the Si wire optical waveguide. FIG. 14 shows the light intensity distribution 41 on a cross section of an xy plane of FIGS. 13A and 13B. As described above, the center of the light intensity distribution 41 is within the Si core layer 13, so that light is mostly confined within the Si core layer 13. However, since light leaks partially into the compound semiconductor core layer 14, a gain can be obtained and laser oscillation becomes possible. To enter the oscillated laser beam into another functional component, optical fiber or the like, an optical circuit may be formed of the Si core layer 13 to guide waveguided light 31 as shown in FIG. 15. Here, a portion extended from the Si core layer 13 in order to guide light to another functional component, namely a portion not having the compound semiconductor core layer 14 and the compound semiconductor substrate 15, may be exposed to air without forming anything on the Si core layer 13 or may have the Si core layer 13 embedded in a polymer, a Si oxide film layer or the like.

SUMMARY OF THE INVENTION

However, the above-described structure has a problem that an optical loss is induced when light is guided from the Si core layer to another functional component. In other words, the optical loss is induced when light is guided from the resonator region 21 of FIG. 15 to the exterior. Here, the resonator region 21 means the entire region of the portion configuring the laser resonator. FIG. 16 shows its situation. FIG. 16 is an xy cross section of an exterior z2 of the resonator region 21 shown in FIG. 15. Here, among light which is guided in the resonator region 21, only light (light distribution 41-1) present in the Si core layer 13 can be guided. Since the exterior of the resonator region 21 does not have the compound semiconductor core layer 14 and the compound semiconductor substrate 15, light (light distribution 41-2) leaked into the compound semiconductor core layer 14 and the compound semiconductor substrate 15 within the resonator region 21 is radiated to the exterior at the end surface of the resonator region 21. This radiated light portion becomes a loss.

Accordingly, the present invention provides a structure and method for optical coupling of a waveguide such as a Si wire with an optical waveguide which is an optical functional component such as the semiconductor laser without a large loss.

One of subject matters of the invention is as follows.

An optical semiconductor device comprises, a first member which has a silicon oxide film formed on a silicon substrate and a silicon core layer formed on the silicon oxide film and extended in a longitudinal direction or one direction of the silicon substrate, and a second member which has a compound semiconductor core layer formed on a compound semiconductor substrate, wherein:

the silicon core layer allows propagation of light within it, the compound semiconductor core layer has a resonator region and a mode conversion region, one end of the resonator region forms a region which is continuous from one end of the mode conversion region, a total length of a length of the resonator region in a light propagation direction and a length of the mode conversion region in a light propagation direction is shorter than a length of the silicon core layer in the light propagation direction, the resonator region is an oscillation region of the semiconductor laser, the mode conversion region has an effective refractive index value which decreases toward the light propagation direction, the compound semiconductor core layer is fixed onto at least a part of the silicon core layer, and the compound semiconductor core layer which is held between the silicon core layer and the compound semiconductor substrate has an effective refractive index value lower than that of the silicon core layer and higher than that of the compound semiconductor substrate.

Another subject matter of the embodiments of the invention is as follows.

An optical waveguide has at least first, second and third layers which are made of a transparent material, wherein the third layer is formed between the first and second layers, the first layer has a refractive index lower than that of the second layer, the second layer has a refractive index lower than that of the third layer, the third layer has at least one optical waveguide stripe structure which has an optical confinement structure in at least two directions in a plane perpendicular to the stacked direction of the first, second and third layers, and in a vicinity of at least one end surface of the second layer which contacts with at least one optical waveguide stripe of the third layer, an effective refractive index of the second layer decreases toward the end surface along a long axis direction of the optical waveguide stripe of the third layer which contacts with the end surface.

According to the present invention, optical coupling of an optical waveguide with an optical waveguide which is an optical functional component such as a semiconductor laser can be performed without a large loss.

Other objects, features and advantages of the invention will become apparent from the following description of the embodiments of the invention taken in conjunction with the accompanying drawings.

DETAILED DESCRIPTION OF THE EMBODIMENTS

Embodiments of the invention will be described in detail below with reference to the figures.

Embodiment 1

Figure 1A:
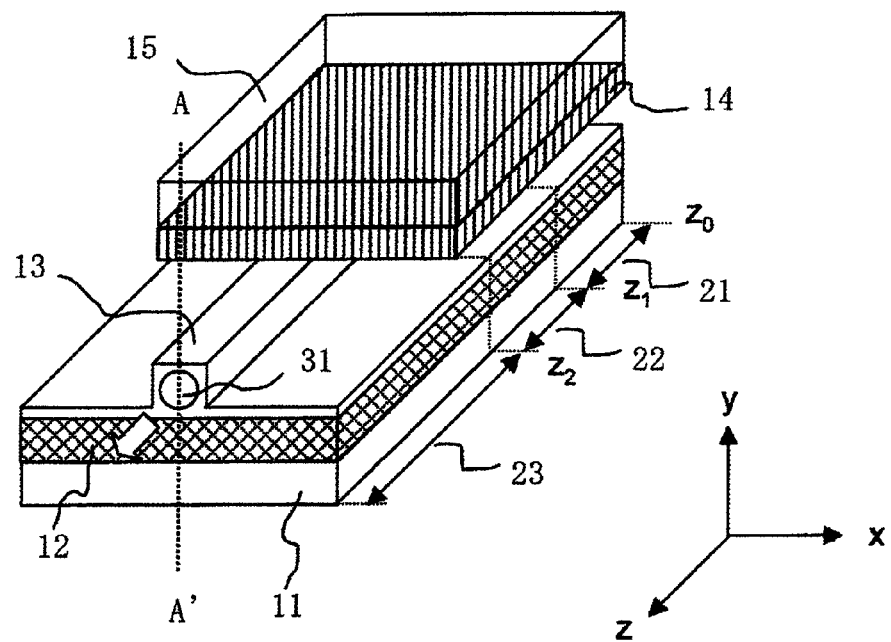
FIG. 1A is a perspective view showing a structure of a first embodiment of the invention.
Figure 1B:
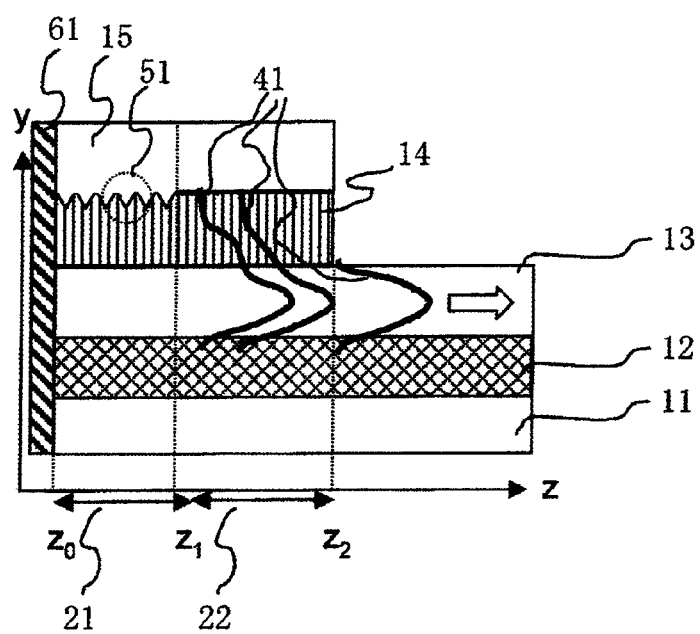
FIG. 1B is a cross-sectional view showing a structure of the first embodiment of the invention.

FIGS. 1A, 1B show a first embodiment of the invention. FIG. 1A shows a perspective view, and FIG. 1B shows a y-z cross-sectional view taken along A-A' of FIG. 1A. This device comprises a resonator region 21 of a semiconductor laser, a mode conversion region 22 and a Si wire region 23. The resonator region 21 has a Si substrate 11, a Si oxide film layer 12, a Si core layer 13, a compound semiconductor core layer 14 and a compound semiconductor substrate 15 stacked in this order from bottom to top. Here, refractive index n1 of the Si oxide film layer 12 is lower than refractive index n2 of the compound semiconductor core layer 14, and the refractive index n2 of the compound semiconductor core layer 14 is lower than refractive index n3 of the Si core layer 13, indicating n1<n2<n3. Further, in the resonator region 21, a grating 51 is formed between the compound semiconductor core layer 14 and the compound semiconductor substrate 15, and a high reflection coating 61 is formed on an end surface z0 to form a resonator of a distributed-feedback type semiconductor laser. In the mode conversion region 22, the Si substrate 11, the Si oxide film layer 12, the Si core layer 13, the compound semiconductor core layer 14 and the compound semiconductor substrate 15 are stacked in this order from bottom to top. In the Si wire region 23, the Si substrate 11, the Si oxide film layer 12 and the Si core layer 13 are stacked in this order from bottom to top. The Si core layer 13 of the regions described above forms a rib type waveguide stripe. Although the periphery of the Si core layer 13 shown in FIG. 1A is air, the Si core layer 13 may be embedded with a polymer, a Si oxide film, or the like. This embodiment covers an example that the high reflection coating is applied to the end surface, but it should be noted that the invention is not limited to the described example. For example, a non-reflection coating may be applied, or such a coating may be omitted. In this embodiment, the distributed-feedback type was described as a resonator type, but it is needless to say that the invention is not limited to that example. For example, a Fabry-Perot type and another type of resonator may be formed.

Figure 2A:
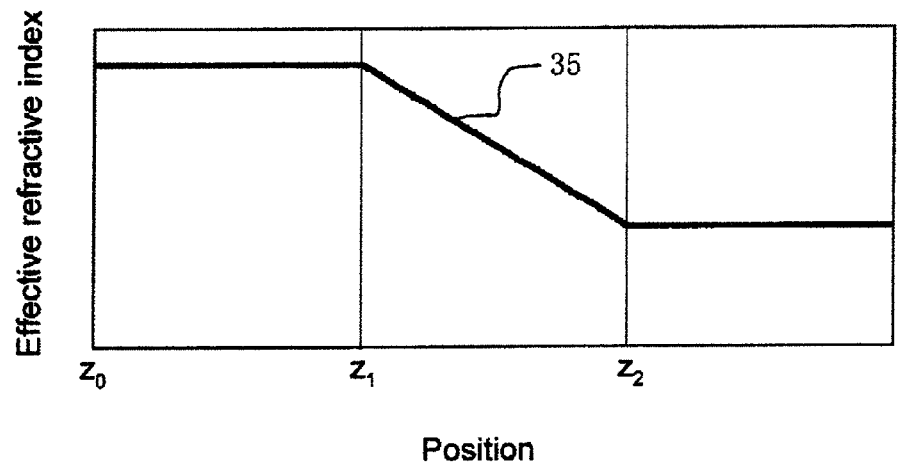
FIG. 2A is a diagram showing an effective refractive index distribution of a compound semiconductor core layer.

FIG. 2A shows an effective refractive index distribution 35 of the compound semiconductor core layer 14. As shown in FIG. 2A, the effective refractive index of the compound semiconductor core layer 14 is decreased toward an end surface z2 of the mode conversion region 22 in the mode conversion region 22. Generally, more light is distributed in a region having a higher refractive index. Therefore, light leaked greatly to the compound semiconductor core layer 14 in the resonator region 21 as shown in FIG. 2B is gradually transferred and confined in the Si core layer 13 having a high refractive index within the mode conversion region 22 when the effective refractive index in the compound semiconductor core layer 14 is decreased, and a light beam shape which is substantially equal to an eigen mode can be obtained in the Si wire region 23.

A coupling loss of the optical waveguide becomes smaller as the overlapping between the shape of light beam to be coupled and the eigen mode of the optical waveguide of the coupling destination becomes larger. Therefore, according to this configuration, light from the resonator region 21 can be coupled with the Si wire region 23 without a large loss, and a sufficiently intense light beam 31 can be obtained from the Si wire region 23.

Figure 2B:
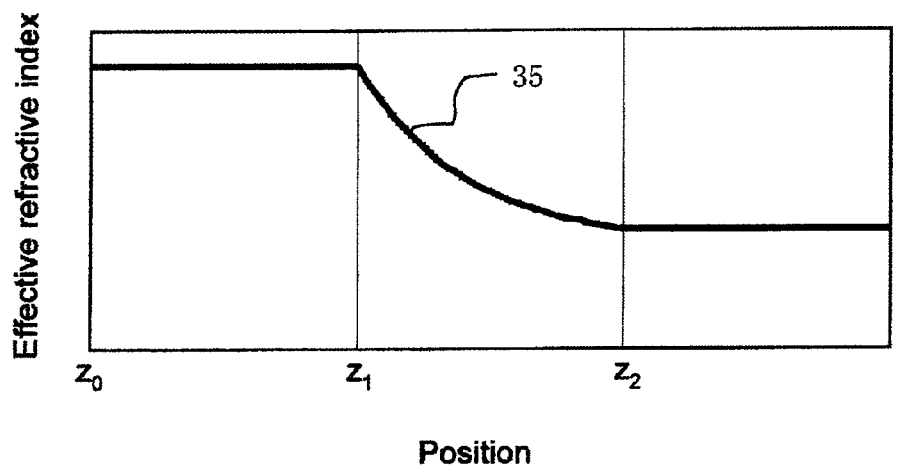
FIG. 2B is a diagram showing an effective refractive index distribution of the compound semiconductor core layer.

FIG. 2A shows that the effective refractive index of the compound semiconductor core layer 14 is linearly decreased from positions z1 to z2 in the optical axis direction, but it may be decreased nonlinearly as shown in FIG. 2B.

To obtain the refractive index distribution of the compound semiconductor core layer 14 as shown in FIGS. 2A, 2B, for example, the compound semiconductor core layer 14 is formed by varying the alloy composition along the stripe direction of the Si core layer 13, ion implantation into the compound semiconductor core layer 14 is performed by varying the concentration along the stripe direction of the Si core layer 13, or the thickness of the compound semiconductor core layer 14 is varied along the stripe direction of the Si core layer 13.

Figure 3A:
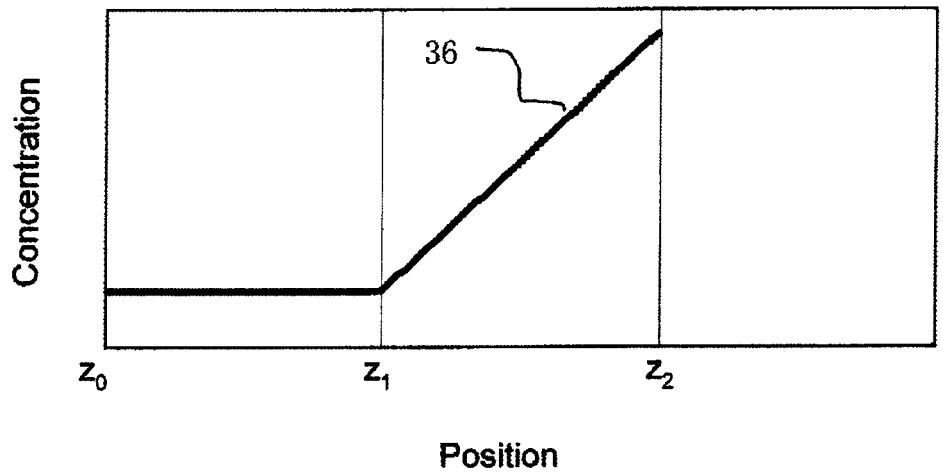
FIG. 3A is a diagram showing a distribution of an implantation concentration of the compound semiconductor core layer.
Figure 3B:
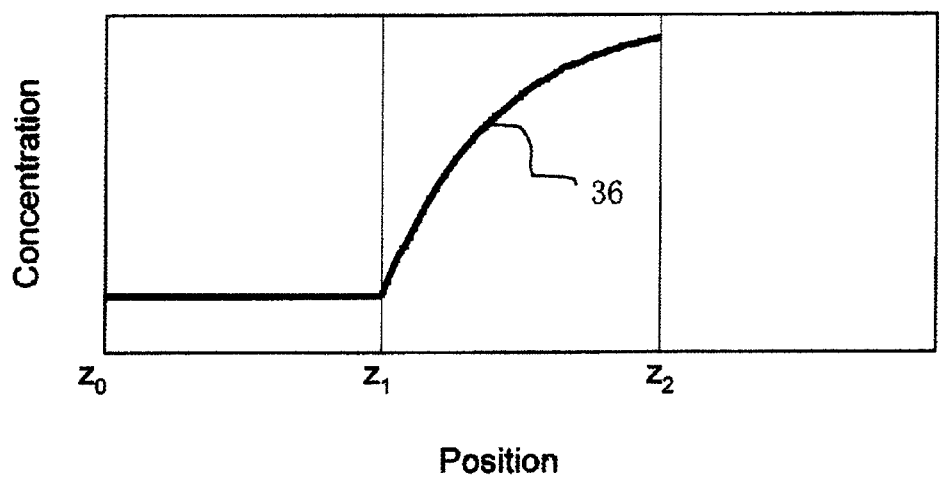
FIG. 3B is a diagram showing a distribution of an implantation concentration of the compound semiconductor core layer.

Here, a method of producing the effective refractive index distribution shown in FIG. 2A or FIG. 2B by ion implantation is described first. Generally, in a case where elements to be used for a semiconductor donor or an acceptor are implanted, the semiconductor refractive index becomes lower as the implantation concentration becomes higher. Therefore, when an implantation concentration 36 is changed along the stripe direction of the Si core layer 13 as shown in FIG. 3A or FIG. 3B, the effective refractive index distribution shown in FIG. 2A or FIG. 2B can be produced in the compound semiconductor core layer 14.

Figure 4A:
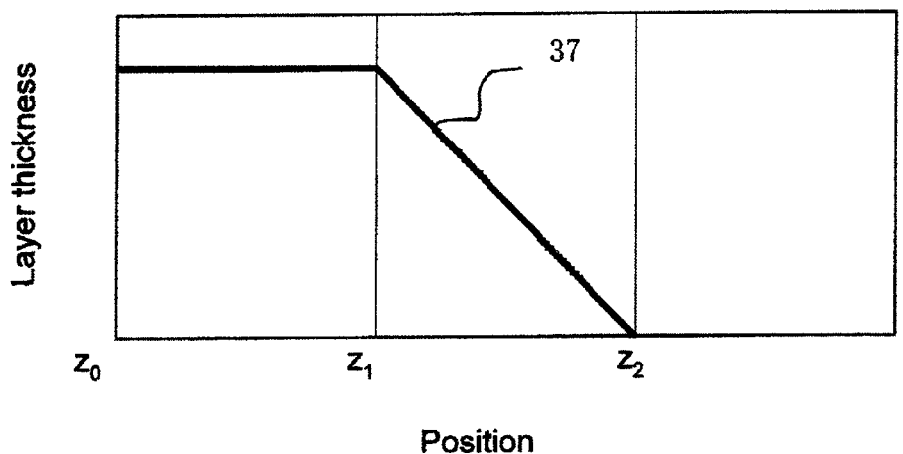
FIG. 4A is a diagram showing a layer thickness distribution of the compound semiconductor core layer.
Figure 4B:
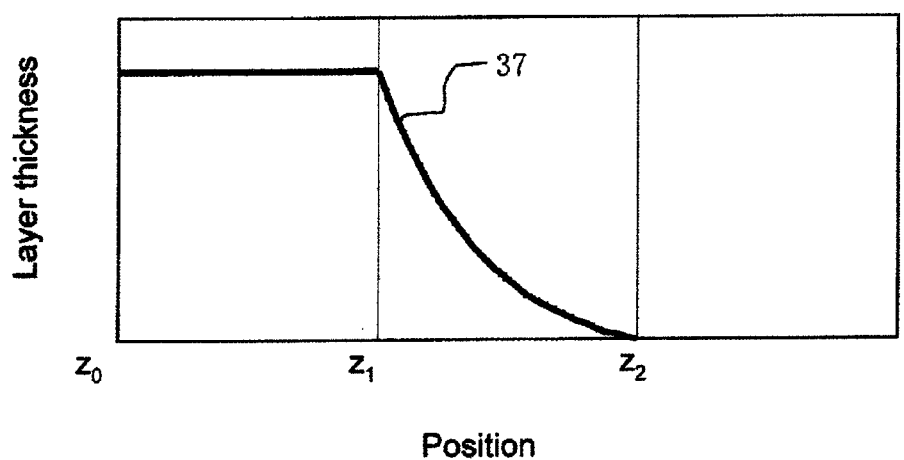
FIG. 4B is a diagram showing a layer thickness distribution of the compound semiconductor core layer.

Next, a method of producing the effective refractive index distribution shown in FIG. 2A or FIG. 2B by adjusting the thickness of the compound semiconductor core layer 14 is described below. The effective refractive index of the compound semiconductor core layer 14 becomes lower as the thickness becomes smaller. Therefore, the effective refractive index distribution shown in FIG. 2A or FIG. 2B can be produced on the compound semiconductor core layer 14 by varying a thickness 37 of the compound semiconductor core layer 14 along the stripe direction of the Si core layer 13 as shown in FIG. 4A or FIG. 4B. The layer thickness distribution as shown in FIG. 4A or FIG. 4B may be produced by selective area growth using a dielectric substance or a Si mask (see, M. Aoki et al., IEEE Photonic Technology Letters, Vol. 8, No. 4, pp. 479-481 (1996) and M. Aoki et al., IEEE Journal Quantum Electronics, Vol. QE29, No. 6, pp. 2088-2096 (1993)).

Embodiment 2

Figure 5:
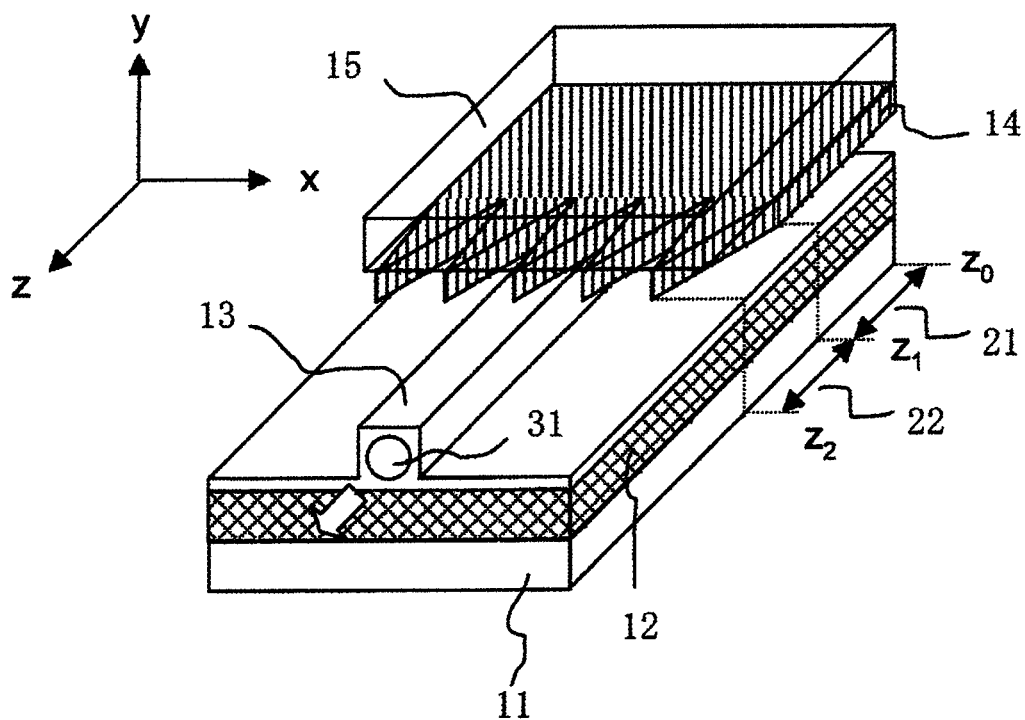
FIG. 5 is a perspective view showing a second embodiment of the invention.

FIG. 5 shows a second embodiment of the invention. In this embodiment, a refractive index is adjusted by fabricating the compound semiconductor core layer 14 to have tapered shapes on the mode conversion region 22.

Figure 6A:
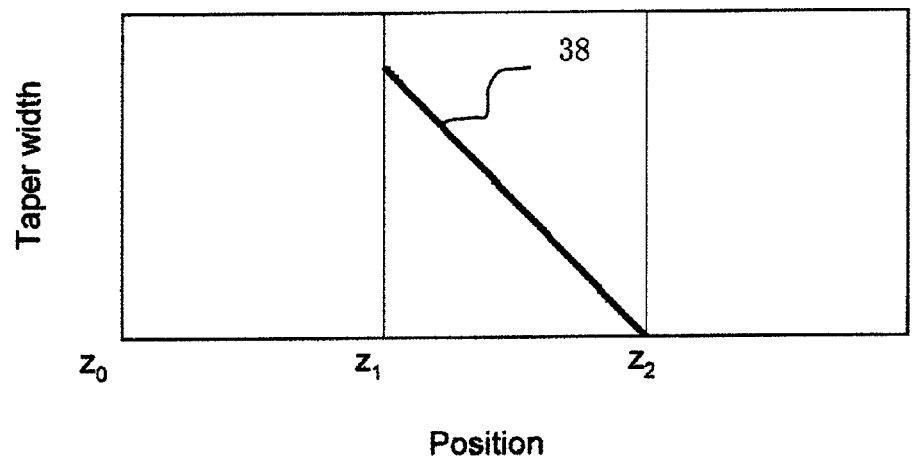
FIG. 6A is a diagram showing a stripe width distribution of the compound semiconductor core layer.
Figure 6B:
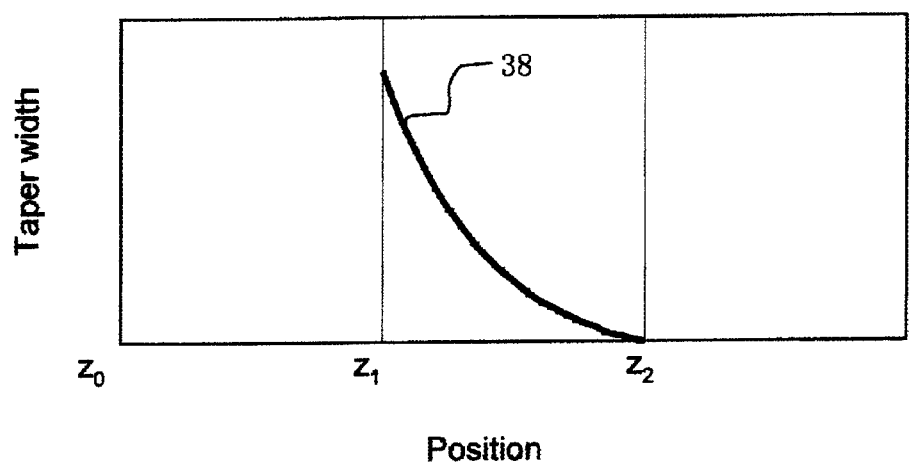
FIG. 6B is a diagram showing a stripe width distribution of the compound semiconductor core layer.
Figure 7:
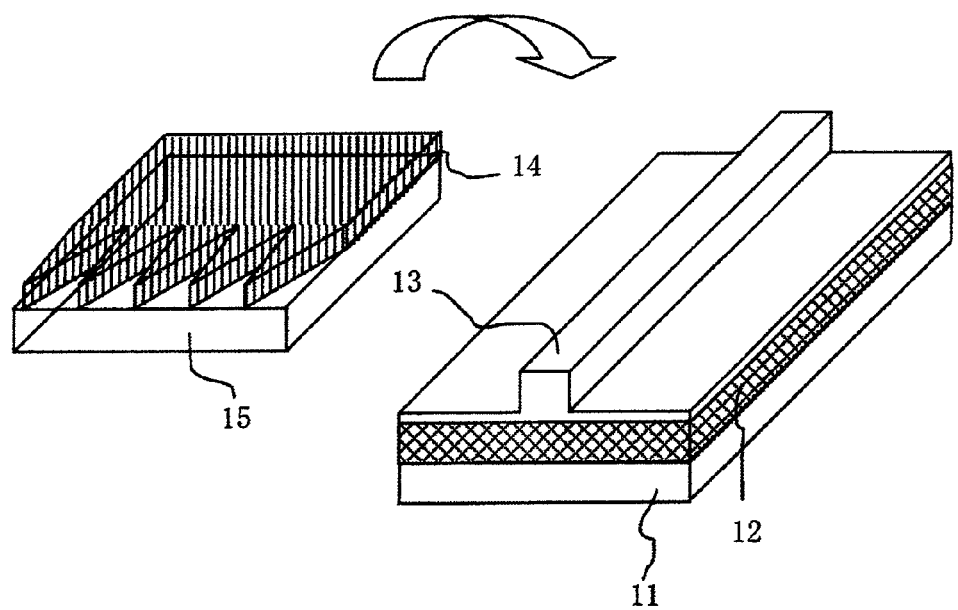
FIG. 7 is a perspective view showing a production method of the second embodiment of the invention.

First, a method of producing the effective refractive index distribution shown in FIG. 2A or FIG. 2B by fabricating the compound semiconductor core layer 14 to have a tapered shape is described. The effective refractive index of the compound semiconductor core layer 14 becomes smaller as the stripe width becomes smaller. Therefore, as shown in FIG. 6A or FIG. 6B, the effective refractive index distribution shown in FIG. 2A or FIG. 2B can be produced on the compound semiconductor core layer 14 by adjusting a stripe width 38 of the compound semiconductor core layer 14 to have a tapered shape along the stripe direction of the Si core layer 13. FIG. 7 shows a production method of this embodiment. First, a compound semiconductor portion and a Si waveguide portion are produced separately. Then, the compound semiconductor core layer 14 of the compound semiconductor portion is bonded to the Si core layer 13 of the Si waveguide portion for completion.

Figure 8A:
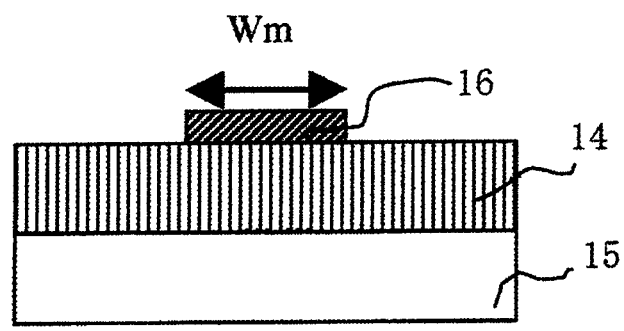
FIG. 8A is a cross-sectional view showing a production process of the second embodiment of the invention.
Figure 8B:
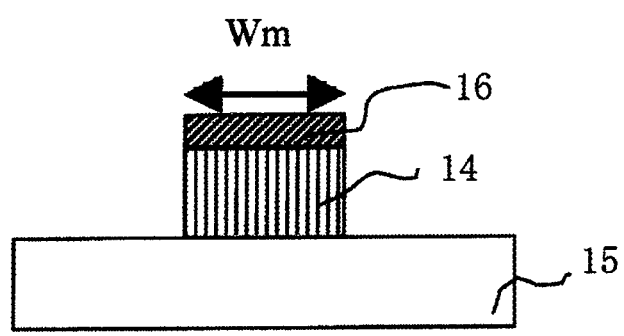
FIG. 8B is a cross-sectional view showing a production process of the second embodiment of the invention.
Figure 8C:
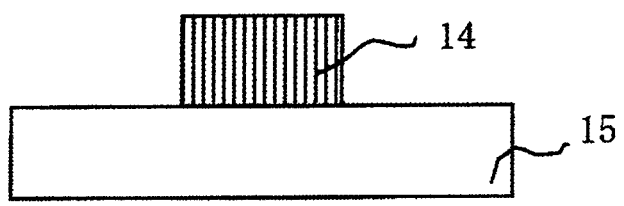
FIG. 8C is a cross-sectional view showing a production process of the second embodiment of the invention.

FIG. 7 shows a method of tapering the compound semiconductor core layer 14 of the compound semiconductor portion. As shown in FIG. 8A, the compound semiconductor core layer 14 is stacked on the compound semiconductor substrate 15, and an etching mask 16 is produced thereon. Then, the compound semiconductor core layer 14 is etched as shown in FIG. 8B. Lastly, the etching mask 16 is removed as shown in FIG. 8C. Here, the width of the etching mask 16 is decreased from z1 to z2 of FIG. 5. Thus, the compound semiconductor core layer 14 having tapered portions shown in FIG. 5 can be obtained.

Figure 9:
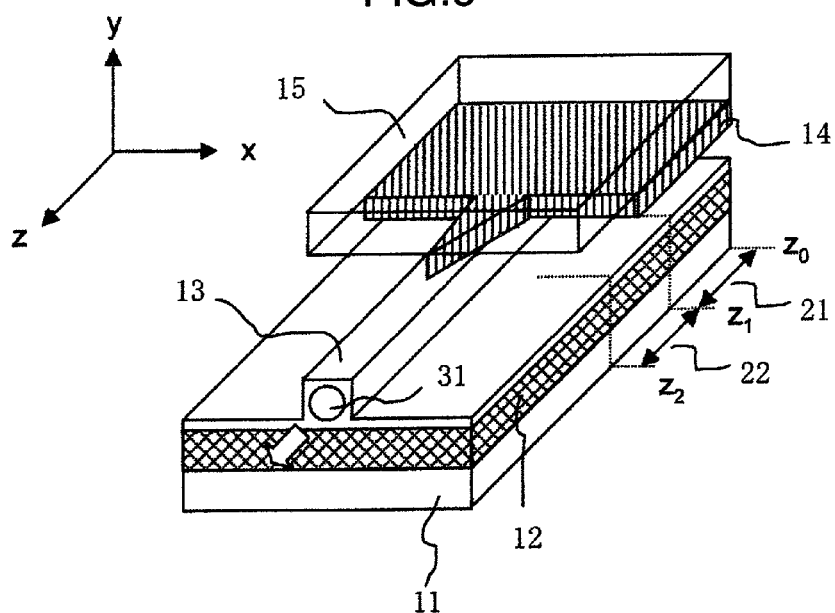
FIG. 9 is a perspective view showing another mode of the second embodiment of the invention.

FIG. 5 shows the compound semiconductor core layer 14 having plural tapered portions, but the tapered portion may be single as shown in FIG. 9.

Embodiment 3

Figure 10:
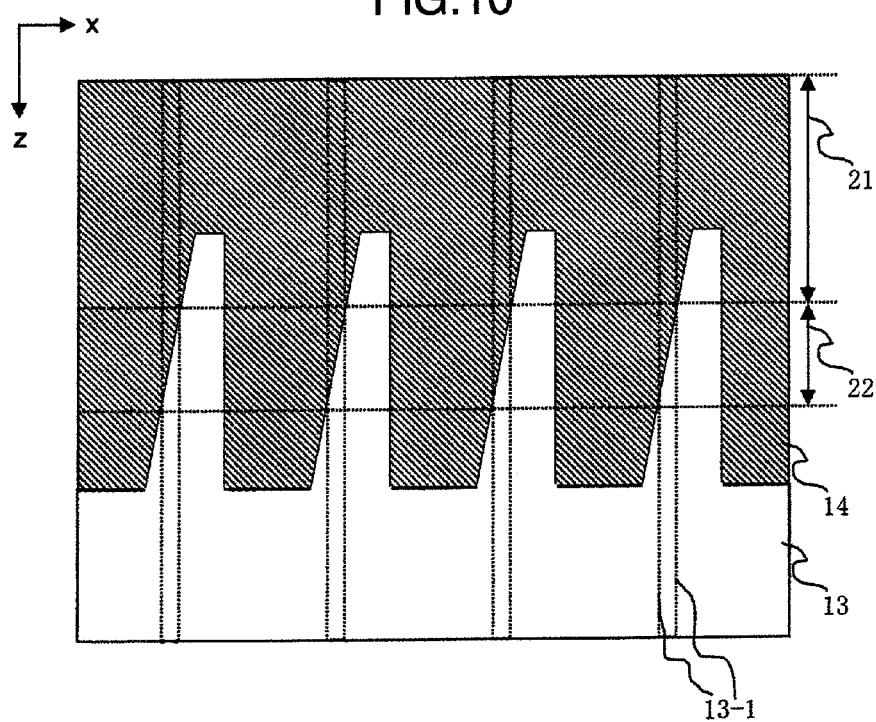
FIG. 10 is a plan view showing a third embodiment of the invention.

FIG. 10 shows a third embodiment of the invention. In this embodiment, the refractive index is varied by making the end surface of the compound semiconductor core layer 14 crossed with side walls 13-1 of the optical waveguide stripe in the mode conversion region 22. The device explained in this embodiment can be easily fabricated because it does not require fine-pattern fabrication techniques to fabricate the compound semiconductor core layer 14.

Embodiment 4

Figure 11:
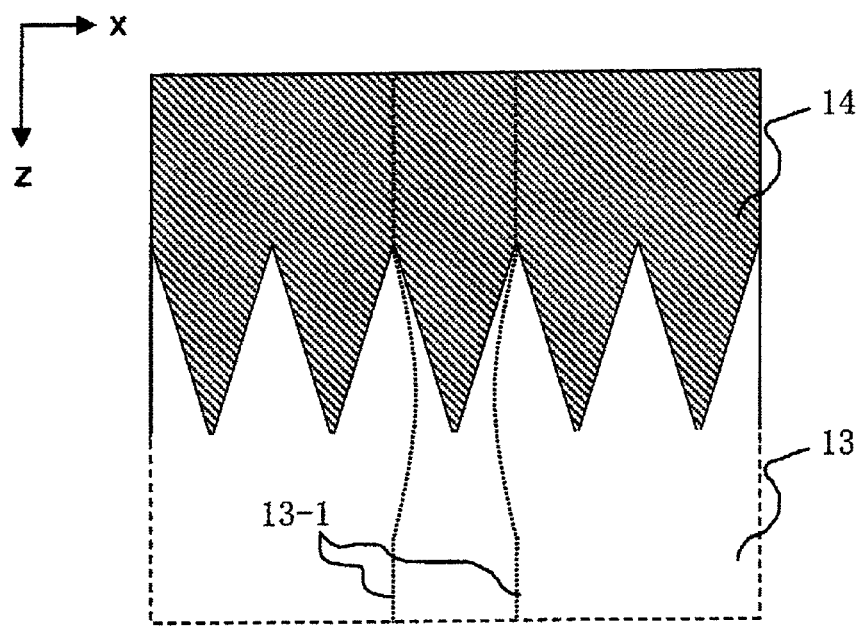
FIG. 11 is a plan view showing a fourth embodiment of the invention.
Figure 12:
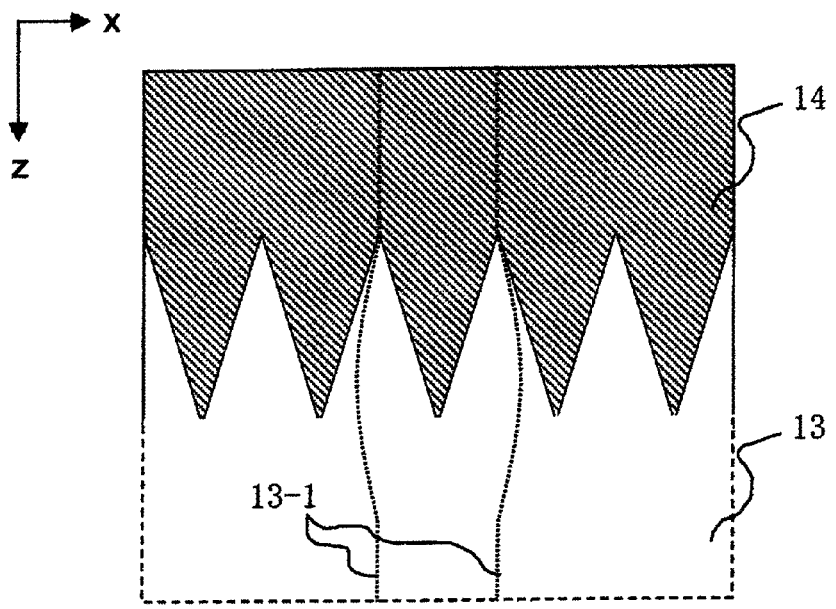
FIG. 12 is a plan view showing another mode of the fourth embodiment of the invention.
Figure 13A:
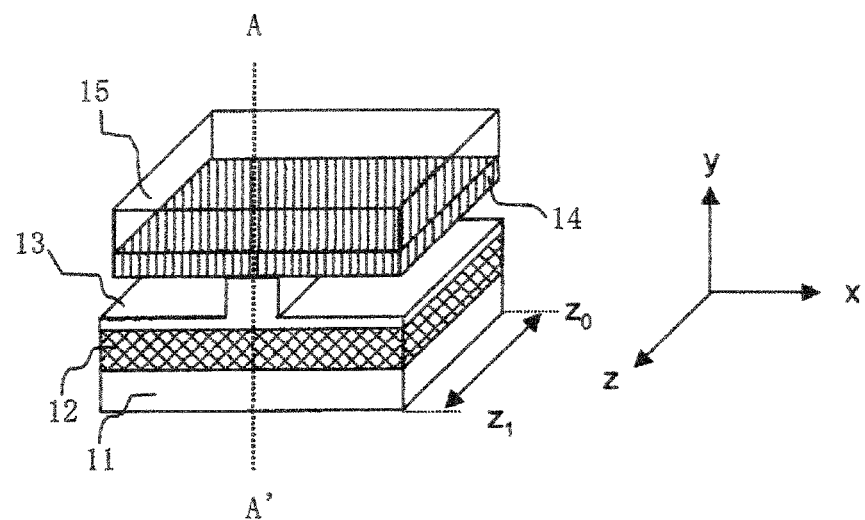
FIG. 13A is a perspective view showing a structure of a conventional optical waveguide.
Figure 13B:
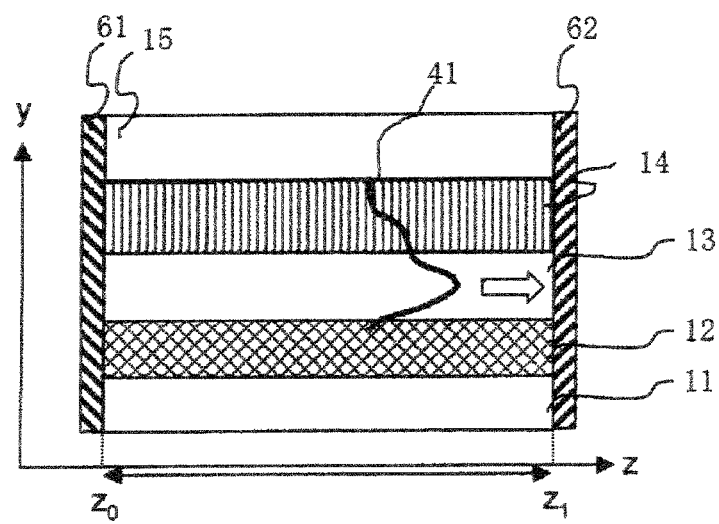
FIG. 13B is a cross-sectional view showing a structure of the conventional optical waveguide.
Figure 14:
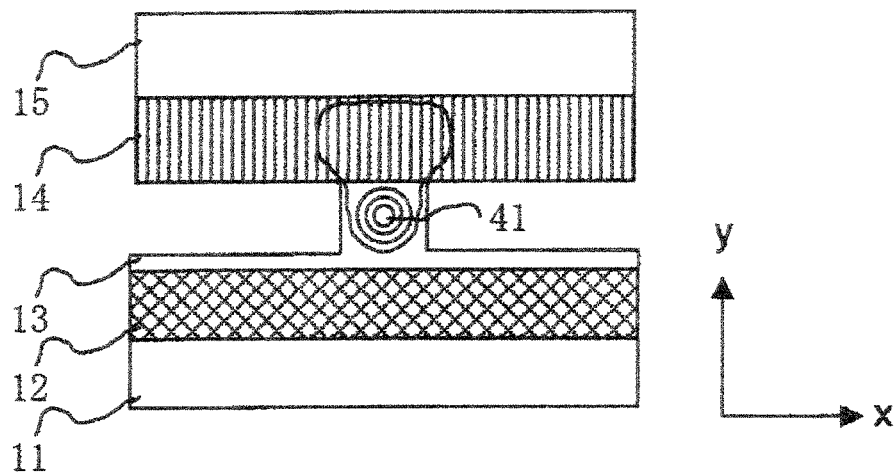
FIG. 14 is a cross-sectional view showing a light intensity distribution of the conventional optical waveguide.
Figure 15:
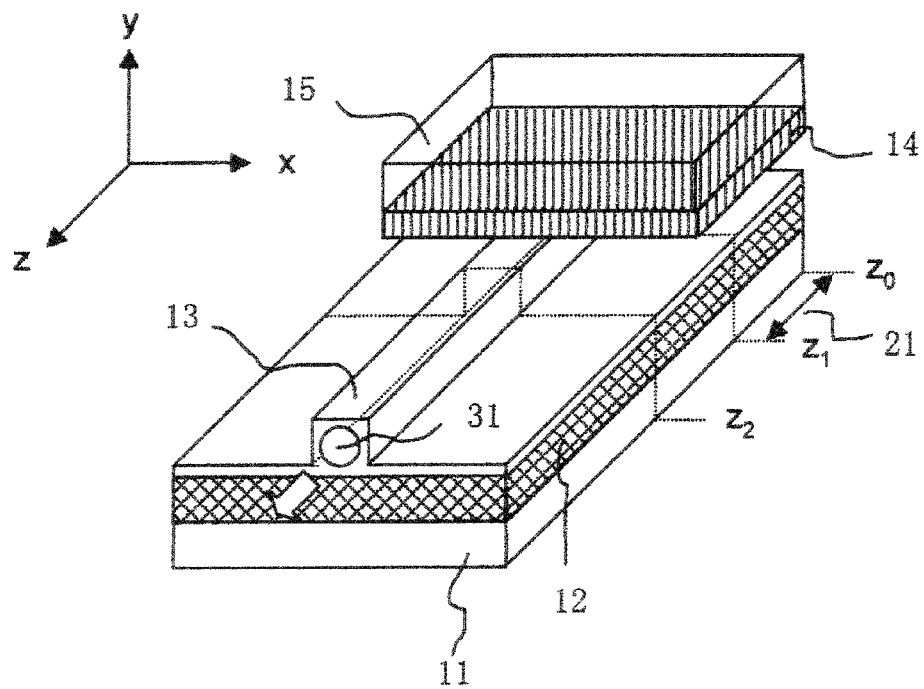
FIG. 15 is a perspective view showing another mode of the conventional optical waveguide.
Figure 16:
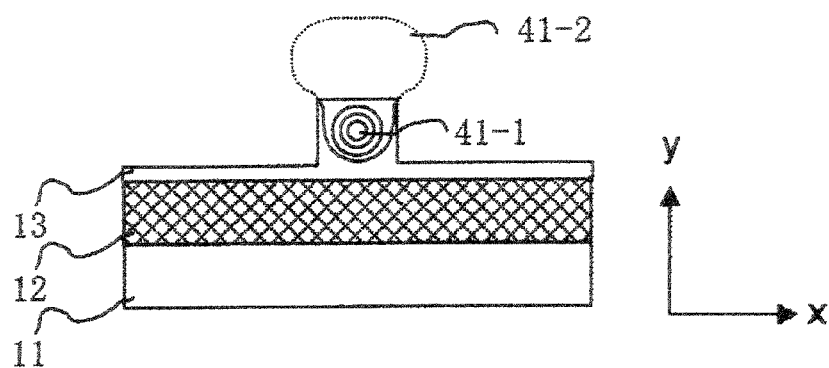
FIG. 16 is a cross-sectional view showing a light intensity distribution of the conventional optical waveguide.

FIG. 11 shows a fourth embodiment of the invention. In this embodiment, the optical coupling efficiency is improved by fabricating the side walls 13-1 of the optical waveguide stripe into a curved shape in a vicinity of the mode conversion region 22. FIG. 11 shows a case that the optical waveguide stripe width is decreased, but it may be increased as shown in FIG. 12 or may be fabricated into another shape.

Embodiment 5

Figure 17:
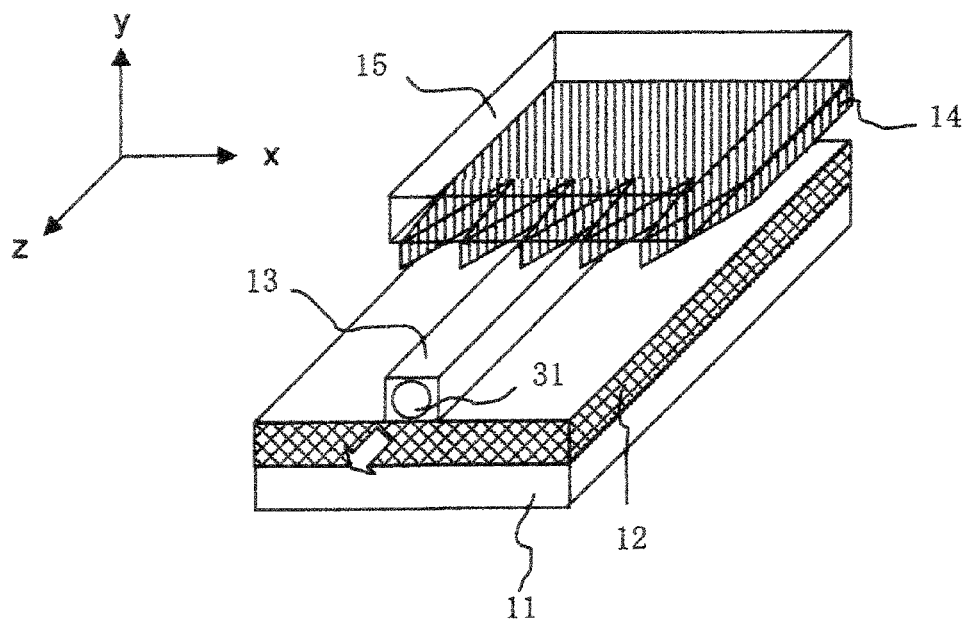
FIG. 17 is a perspective view showing another mode of the fourth embodiment of the invention.

FIG. 17 shows a fifth embodiment of the invention. According to the invention, a cross section of the Si core layer 13 which is perpendicular to the optical axis may be rectangular as in this embodiment.

The present invention is effective without being limited to the materials and the optical confinement method described in the above-described embodiments.

Technical matters related to the embodiments of the invention are as follows.

1. An optical waveguide having at least first, second and third layers which are formed of a transparent material, wherein the third layer is formed between the first and second layers, the first layer has a refractive index lower than that of the second layer, the second layer has a refractive index lower than that of the third layer, the third layer has at least one optical waveguide stripe structure which has an optical confinement structure in at least two directions in a plane perpendicular to a stacked direction of the first, second and third layers, and in a vicinity of at least one end surface of the second layer which contacts with at least one optical waveguide stripe of the third layer, an effective refractive index of the second layer becomes smaller toward the end surface along a long axis direction of the optical waveguide stripe of the third layer which contacts with the end surface.

2. The optical waveguide according to the above 1, wherein, in a vicinity of the end surface of at least one second layer which contacts with at least one optical waveguide stripe of the third layer, the second layer is formed to have at least one tapered structure the width of which in a plane perpendicular to the thickness direction becomes narrower toward the end surface along a long axis direction of the optical waveguide stripe of the third layer which contacts with the end surface.

3. The optical waveguide according to the above 1, wherein a component, projected on a plane perpendicular to the thickness direction, of a normal line of at least one end surface of said second layer which contacts with at least one optical waveguide stripe of said third layer, is not parallel with the long axis of the optical waveguide stripe.

4. The optical waveguide according to the above 1, wherein a material different from the main component of the second layer is implanted into the second layer in a vicinity of at least one end surface of the second layer which contacts with at least one optical waveguide stripe of the third layer, and the concentration of the implanted material is varied along the long axis of the optical waveguide stripe.

5. The optical waveguide according to the above 2, wherein the first layer is made of silicon oxide, the second layer is made of a compound semiconductor, and the third layer is made of silicon.

6. The optical waveguide according to the above 3, wherein the first layer is made of silicon oxide, the second layer is made of a compound semiconductor, and the third layer is made of silicon.

7. The optical waveguide according to the above 4, the first layer is made of silicon oxide, the second layer is made of a compound semiconductor, and the third layer is made of silicon.

8. The optical waveguide according to the above 5, wherein a region in which an effective refractive index of the second layer does not decrease along the optical waveguide stripe of the third layer functions as a semiconductor laser.

9. The optical waveguide according to the above 8, wherein a transparent electrode is provided between the second layer and the third layer.

10. The optical waveguide according to the above 5, wherein a region in which an effective refractive index of the second layer does not decrease along the optical waveguide stripe of the third layer functions as a photodetector.

11. The optical waveguide according to the above 10, wherein a transparent electrode is provided between the second layer and the third layer.

12. The optical waveguide according to the above 5, wherein a region in which an effective refractive index of the second layer does not decrease along the optical waveguide stripe of the third layer functions as an optical modulator.

13. The optical waveguide according to the above 12, wherein a transparent electrode is provided between the second layer and the third layer.

14. The optical waveguide according to the above 6, wherein a region in which an effective refractive index of the second layer does not decrease along the optical waveguide stripe of the third layer functions as a semiconductor laser.

15. The optical waveguide according to the above 14, wherein a transparent electrode is provided between the second layer and the third layer.

16. The optical waveguide according to the above 6, wherein a region in which an effective refractive index of the second layer does not decrease along the optical waveguide stripe of the third layer functions as a photodetector.

17. The optical waveguide according to the above 16, wherein a transparent electrode is provided between the second layer and the third layer.

18. The optical waveguide according to the above 6, wherein a region in which an effective refractive index of the second layer does not decrease along the optical waveguide stripe of the third layer functions as an optical modulator.

19. The optical waveguide according to the above 18, wherein a transparent electrode is provided between the second layer and the third layer.

The invention claimed is:

1. An optical semiconductor device, comprising:
a first member which comprises a silicon oxide film formed on a silicon substrate and a silicon core layer formed on said silicon oxide film and extended in a longitudinal direction or one direction of said silicon substrate, and
a second member which comprises a compound semiconductor core layer formed on a compound semiconductor substrate, wherein:
said silicon core layer comprises a stripe structure,
said silicon core layer is configured to allow propagation of light within it,
the compound semiconductor core layer comprises a resonator region and a mode conversion region,
one end of the resonator region forms a region which is continuous from one end of the mode conversion region, and a total length of a length of the resonator region in a light propagation direction and a length of the mode conversion region in the light propagation direction is shorter than a length of said silicon core layer in the light propagation direction,
said resonator region comprises an oscillation region of a semiconductor laser,
said mode conversion region includes a plurality of portions tapered to decrease in width in the light propagation direction for outputting light from the silicon core layer, said plurality of tapered portions being located on an opposite side of said mode conversion region from said one end of said mode conversion region, each of said tapered portions being configured to be tapered to have an effective refractive index value which decreases toward the light propagation direction for outputting light from the silicon core layer,
a width of said second member perpendicular to said stripe structure is larger than a width of said stripe structure,
the plurality of tapered portions are lined up in a direction parallel to said silicon substrate and crossing a stripe direction of said stripe structure,
said compound semiconductor core layer is fixed onto at least a part of said silicon core layer, and
said compound semiconductor core layer which is provided between said silicon core layer and said compound semiconductor substrate has an effective refractive index value lower than that of said silicon core layer and higher than that of said compound semiconductor substrate.

2. The optical semiconductor device according to claim 1, wherein light within said silicon core layer and said compound semiconductor core layer is confined by said silicon oxide layer and said compound semiconductor substrate.

3. The optical semiconductor device according to claim 1, wherein one of said tapered portions is overlapped with said silicon core layer to make optical coupling of the first member and the second member.

4. The optical semiconductor device according to claim 1, wherein said semiconductor laser includes a grating.

5. The optical semiconductor device according to claim 4, wherein said grating is formed in a surface of said compound semiconductor core in said resonator region, which surface faces said compound semiconductor substrate.

6. The optical semiconductor device according to claim 4, wherein said grating comprises a distributed feedback type (DFB) laser.

7. The optical semiconductor device according to claim 5, wherein said grating comprises a distributed feedback type (DFB) laser.

8. The optical semiconductor device according to claim 6, further comprising a high reflection coating formed in relation to the grating to form the DFB laser.

9. The optical semiconductor device according to claim 7, further comprising a high reflection coating formed in relation to the grating to form the DFB laser.

10. The optical semiconductor device according to claim 1, wherein the refractive index of the silicon core layer is higher than the refractive index of the compound semiconductor core layer.

11. An optical waveguide having at least first, second and third layers which are comprised of a transparent material, wherein:
    said third layer is formed between said first and second layers,
    said first layer has a refractive index lower than that of said second layer,
    said second layer has a refractive index lower than that of said third layer,
    said third layer has an optical waveguide stripe structure which has an optical confinement structure in at least two directions in a plane perpendicular to the stacked direction of said first, second and third layers,
    a light intensity in said second layer is greater than a light intensity in said first layer, and
    said second layer has an edge crossing obliquely over an edge of said optical waveguide stripe structure as an effective refractive index of said second layer decreases along a long axis direction of the optical waveguide stripe structure,
    wherein a width of the second layer is the same as a width of the device at a same position in the light propagation direction or greater than a spot size of propagating light at a same position in the light propagation direction at least one portion of the device.

12. An optical semiconductor device, comprising:
    a first member which comprises a silicon oxide film formed on a silicon substrate and a silicon core layer formed on said silicon oxide film and extended in a longitudinal direction or one direction of said silicon substrate, and
    a second member which comprises a compound semiconductor core layer formed on a compound semiconductor substrate wherein:
    said silicon core layer comprises a stripe structure,
    said silicon core layer is configured to allow propagation of light within it,
    said compound semiconductor core layer comprises a resonator region and a mode conversion region, and
    wherein a width of the compound semiconductor core layer is the same as a width of the device at a same position in the light propagation direction or greater than a spot size of propagation light at a same position in the light propagation direction at least one portion of the device;
    one end of the resonator region forms a region which is continuous from one end of the mode conversion region, and a total length of a length of the resonator region in a light propagation direction and a length of the mode conversion region in the light propagation direction is shorter than a length of said silicon core layer in the light propagation direction,
    said resonator region comprises an oscillation region of a semiconductor laser,
    said compound semiconductor core layer has an edge crossing obliquely over an edge of said stripe structure as an effective refractive index of said compound semiconductor core layer decreases along a long axis direction of the stripe structure,
    a width of said second member perpendicular to said stripe structure is larger than a width of said stripe structure,
    said compound semiconductor core layer is fixed onto at least a part of said silicon core layer, and
    said compound semiconductor core layer which is provided between said silicon core layer and said compound semiconductor substrate has an effective refractive index value lower than that of said silicon core layer and higher than that of said silicon oxide.

* * * * *

UNITED STATES PATENT AND TRADEMARK OFFICE
CERTIFICATE OF CORRECTION

PATENT NO. : 8,965,153 B2
APPLICATION NO. : 11/950447
DATED : February 24, 2015
INVENTOR(S) : Makoto Takahashi et al.

It is certified that error appears in the above-identified patent and that said Letters Patent is hereby corrected as shown below:

Title page, item (73) Assignee:

"Hitachi Ltd., Tokyo (JP)" should read -- Hitachi, Ltd., Tokyo (JP) --

Signed and Sealed this
Sixth Day of October, 2015

Michelle K. Lee
*Director of the United States Patent and Trademark Office*